United States Patent
He et al.

(10) Patent No.: US 12,230,693 B2
(45) Date of Patent: Feb. 18, 2025

(54) SEMICONDUCTOR DEVICE AND MANUFACTURING METHOD THEREFOR

(71) Applicant: CSMC TECHNOLOGIES FAB2 CO., LTD., Wuxi (CN)

(72) Inventors: Nailong He, Wuxi (CN); Sen Zhang, Wuxi (CN)

(73) Assignee: CSMC TECHNOLOGIES FAB2 CO., LTD., Wuxi (CN)

(*) Notice: Subject to any disclaimer, the term of this patent is extended or adjusted under 35 U.S.C. 154(b) by 344 days.

(21) Appl. No.: 17/765,295

(22) PCT Filed: Aug. 18, 2020

(86) PCT No.: PCT/CN2020/109721
§ 371 (c)(1),
(2) Date: Mar. 30, 2022

(87) PCT Pub. No.: WO2021/135262
PCT Pub. Date: Jul. 8, 2021

(65) Prior Publication Data
US 2022/0367682 A1    Nov. 17, 2022

(30) Foreign Application Priority Data
Dec. 30, 2019  (CN) .......................... 201911395825.7

(51) Int. Cl.
*H01L 21/00*   (2006.01)
*H01L 21/04*   (2006.01)
(Continued)

(52) U.S. Cl.
CPC .... *H01L 29/66681* (2013.01); *H01L 21/0415* (2013.01); *H01L 21/76202* (2013.01);
(Continued)

(58) Field of Classification Search
CPC .......... H01L 29/66681; H01L 21/0415; H01L 21/76202; H01L 29/66492; H01L 29/7816; H01L 29/0847
See application file for complete search history.

(56) References Cited

U.S. PATENT DOCUMENTS 5,539,238 A * 7/1996 Malhi ................. H01L 29/7835
257/E29.267
5,844,275 A * 12/1998 Kitamura ............ H01L 29/7835
257/E29.066
(Continued)

FOREIGN PATENT DOCUMENTS

| CN | 101150146 | 3/2008 |
|---|---|---|
| CN | 110581174 | 12/2019 |

OTHER PUBLICATIONS

PCT International Search Report and Written Opinion (with English translations) for corresponding Application No. PCT/CN2020/109721, mailed on Nov. 24, 2020—9 pages.

*Primary Examiner* — Richard A Booth
(74) *Attorney, Agent, or Firm* — Dority & Manning, P.A.

(57) ABSTRACT

A semiconductor device and a manufacturing method therefor. The semiconductor device comprises: a semiconductor substrate. A first drift region is formed in the semiconductor substrate. A gate structure is formed on the semiconductor substrate A part of the gate structure covers a part of the first drift region. A first trench is formed in the first drift region, and a drain region is formed in the semiconductor substrate at the bottom of the first trench.

17 Claims, 2 Drawing Sheets

(51) Int. Cl.
*H01L 21/762* (2006.01)
*H01L 29/66* (2006.01)
*H01L 29/78* (2006.01)
*H01L 29/08* (2006.01)

(52) U.S. Cl.
CPC .... *H01L 29/66492* (2013.01); *H01L 29/7816* (2013.01); *H01L 29/0847* (2013.01)

(56) References Cited

U.S. PATENT DOCUMENTS

| | | |
|---|---|---|
| 8,004,039 B2 | 8/2011 | Zinn |
| 2007/0096245 A1* | 5/2007 | Kariyama ......... H01L 21/26586 |
| | | 257/E21.345 |
| 2019/0378925 A1* | 12/2019 | Shinohara ........... H01L 29/0878 |

* cited by examiner

SEMICONDUCTOR DEVICE AND MANUFACTURING METHOD THEREFOR

CROSS REFERENCE TO RELATED APPLICATIONS

This application is a national stage of International Application No. PCT/CN2020/109721, filed on Aug. 18, 2020, and entitled "SEMICONDUCTOR DEVICE AND MANUFACTURING METHOD THEREFOR", which claims priority to Chinese Patent Application No. 201911395825.7, filed on Dec. 30, 2019, and entitled "SEMICONDUCTOR DEVICE AND MANUFACTURING METHOD THEREFOR", the content of which are incorporated herein by reference in their entireties.

TECHNICAL FIELD

The present disclosure relates to the field of semiconductor technology, and particularly relates to a semiconductor device and a manufacturing method therefor.

BACKGROUND

With the continuous development of semiconductor technology, lateral double diffused metal oxide semiconductor field-effect transistor (Lateral Double Diffused MOSFET, LDMOS) devices and Extended Drain Metal Oxide Semiconductor (EDMOS) devices are widely applied due to characteristics such as relatively high working voltage, simple process, easy to be compatible with low-voltage complementary metal oxide semiconductor (CMOS) circuits in terms of process. Compared with common MOS devices, both LDMOS and EDMOS have a lightly doped implanted region at the drain electrode, called a drift region. Since LDMOS and EDMOS are usually applied in power circuits which need to obtain relatively large output power, they must be able to withstand relatively high breakdown voltages.

At present, LDMOS and EDMOS are both silicon surface devices. As transistors designed for a specific working voltage level, while obtaining a certain withstand voltage, it is necessary to reduce the on-resistance of the transistor as much as possible. The on-resistance is mainly formed by three parts: a channel (channel), a junction field effect transistor (JFET) region, and a drift region (Drift). The higher the working voltage level of the device, the higher the proportion of the drift region in the entire on-resistance. However, the withstand voltage is carried by the lateral drift region, and the drift region of a transistor with a certain withstand voltage would have a certain length, or in other words, would have a lower limit for the length (the physical limit of silicon withstand voltage). Therefore, the size of the drift region cannot be reduced indefinitely. Even if the characteristic size of the process is reduced, the size of the withstand voltage cannot be reduced.

Therefore, it is necessary to propose a novel semiconductor device to solve the above problems.

SUMMARY

In the section of the summary, a series of simplified concepts are introduced, which will be described in further detail in the section of the detailed description of the embodiments. The section of the summary of the present disclosure does not mean an attempt to limit the key features and necessary technical features of the claimed technical solution, nor does it mean an attempt to determine the protection scope of the claimed technical solution.

The present disclosure provides a semiconductor device, which includes:
 a semiconductor substrate;
 a first drift region formed in the semiconductor substrate, a first trench being formed in the first drift region;
 a gate structure formed on the semiconductor substrate, a part of the gate structure covering a part of the first drift region; and
 a drain region formed in the semiconductor substrate at a bottom of the first trench.

The present disclosure provides a manufacturing method for a semiconductor device, which includes the following steps:
 providing a semiconductor substrate, and forming a first drift region in the semiconductor substrate;
 forming a gate structure on the semiconductor substrate, with a part of the gate structure covering a part of the first drift region;
 etching the first drift region to form a first trench in the first drift region; and
 performing ion implantation to form a drain region in the semiconductor substrate at a bottom of the first trench.

According to the semiconductor device and the manufacturing method therefor provided by the present disclosure, by forming the trench in the drift region and forming the drain region in the semiconductor substrate at the bottom of the trench, the length of the drift region is lengthened longitudinally, thereby improving the withstand voltage of the semiconductor device while reducing the area of the semiconductor device.

BRIEF DESCRIPTION OF THE DRAWINGS

By describing the embodiments of the present disclosure in more detail with reference to the accompanying drawings, the above and other purposes, features and advantages of the present disclosure will become more apparent. The accompanying drawings are used to provide a further understanding of the embodiments of the present disclosure, and constitute a part of the specification, and which, together with the embodiments of the present disclosure, are used to explain the present disclosure and do not constitute any limitation to the present disclosure. In the accompany drawings, the same reference numerals generally represent the same components or steps.

In the accompanying drawings.

DETAILED DESCRIPTION OF THE EMBODIMENTS

In the description hereafter, numerous specific details are set forth in order to provide a more thorough understanding of the present disclosure. However, it will be apparent to those skilled in the art that the present disclosure may be implemented without one or more of these details. In other examples, in order to avoid confusion with the present disclosure, some technical features known in the art are not described.

Figure 1:
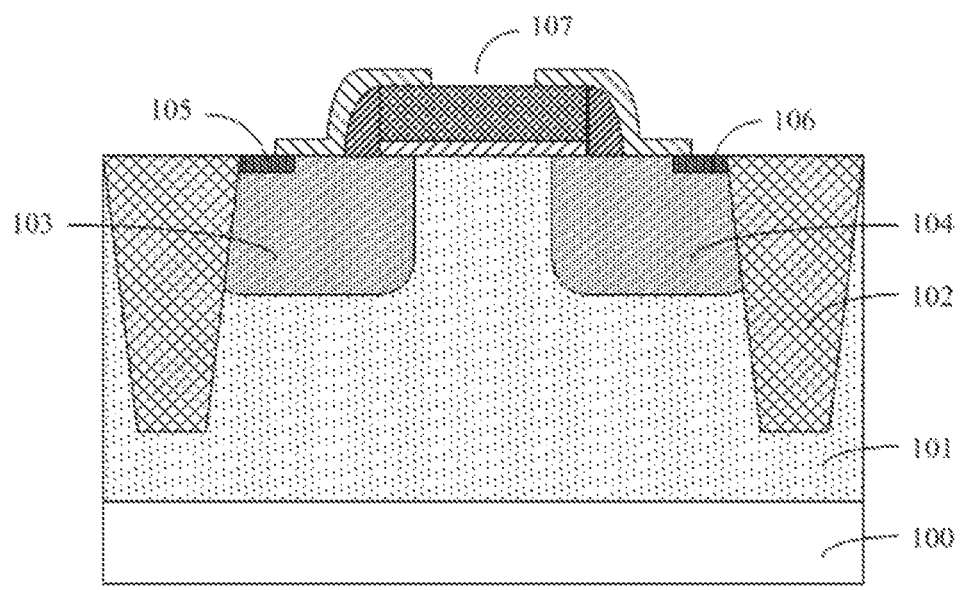
FIG. 1 is a cross-sectional view of an exemplary semiconductor device.

In an exemplary technique, as shown in FIG. 1, a semiconductor device includes a substrate 100, a well region 101, an isolation structure 102, drift regions 103 and 104, a source region 105, a drain region 106, and a gate structure 107. The withstand voltage of the transistor is carried by a lateral drift, region, and the drift region of a transistor with a certain withstand voltage would have a certain length, or in other words, would have a lower limit for the length (the physical limit of silicon withstand voltage). Therefore, the size of the drift region cannot be reduced indefinitely. Even if the characteristic size of the process is reduced, the size of the withstand voltage cannot be reduced.

In view of the deficiencies of the semiconductor device shown in FIG. 1, the present disclosure provides a semiconductor device and a manufacturing method therefor.

Figure 2A:
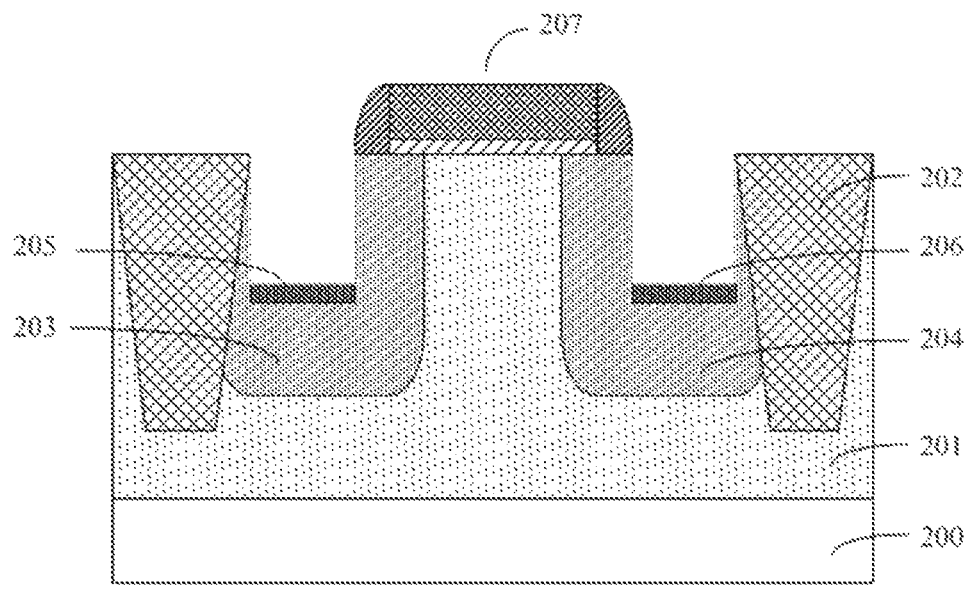
FIG. 2A is a cross-sectional view of a semiconductor device according to an exemplary embodiment of the present disclosure.
Figure 2B:
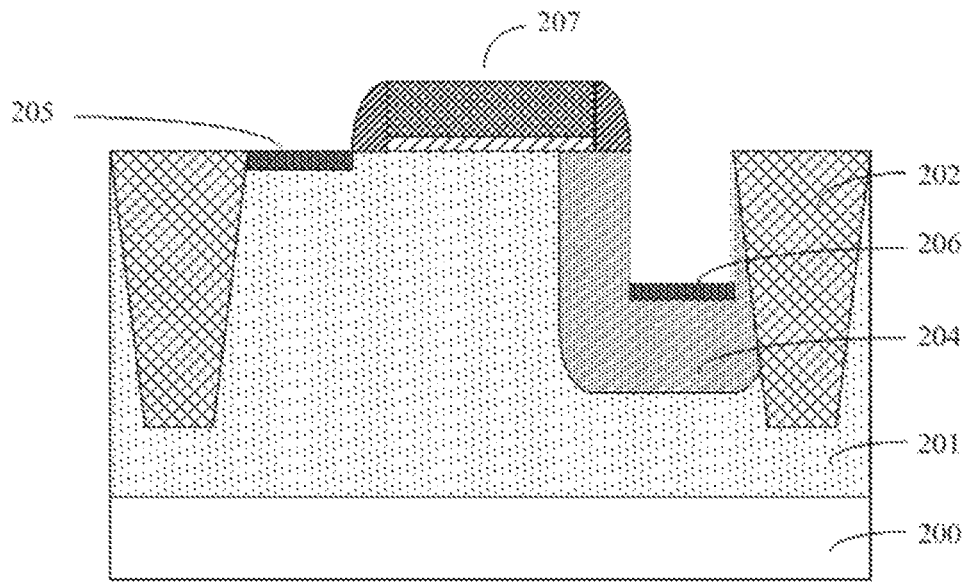
FIG. 2B is a cross-sectional view of another semiconductor device according to an exemplary embodiment of the present disclosure.

Referring to FIGS. 2A and 2B, in which, FIG. 2A is a cross-sectional view of a semiconductor device according to an exemplary embodiment of the present disclosure, and FIG. 2B is a cross-sectional view of another semiconductor device according to an exemplary embodiment of the present disclosure.

According to an embodiment of the present disclosure, the structure of the semiconductor device provided by the embodiment of the present disclosure will be described with reference to FIG. 2A and FIG. 2B. The semiconductor device includes:

a semiconductor substrate 200, in which a first drift region 204 is formed;

a gate structure 207 is formed on the semiconductor substrate, and a part of the gate structure 207 covers a part of the first drift region 204; and a first trench is formed in the first drift region 204, and a drain region 206 is formed in the semiconductor substrate at a bottom of the first trench.

Illustratively, the semiconductor device includes an LDMOS device or an EDMOS device.

Illustratively, the semiconductor substrate 200 may be at least one of the following mentioned materials: single crystal silicon, silicon on insulator (SOI), stacked silicon on insulator (SSOI), stacked silicon germanium on insulator (S-SiGeOI), silicon germanium on insulator (SiGeOI), germanium on insulator (GeOI), and the like. In this embodiment, the semiconductor substrate 200 is a P-type silicon substrate (P-sub), and a specific doping concentration thereof is not limited by the present disclosure. The semiconductor substrate 200 may be formed by epitaxial growth, or may be a wafer substrate.

Illustratively, an isolation structure 202 is further formed in the semiconductor substrate 200. The isolation structure 202 is a shallow trench isolation (STI) structure or a local oxidation of silicon (LOCOS) isolation structure. The isolation structure divides the semiconductor substrate 200 into different active regions, and various semiconductor devices, such as N-type metal oxide semiconductor (NMOS) and P-type metal oxide semiconductor (PMOS) and the like, can be formed in the active regions. Various well structures are further formed in the semiconductor substrate 200.

Illustratively, a well region 201 is formed in the semiconductor substrate 200. As an example, a P-type well region (P-well) is formed in the semiconductor substrate 200.

Illustratively, at least a first drift region (Drift) 204 is formed in the semiconductor substrate 200.

In an embodiment, only the first drift region 204 is formed in the semiconductor substrate, as shown in FIG. 2B.

In another embodiment, a first drift region 204 and a second drift region 203 are formed in the semiconductor substrate, as shown in FIG. 2A.

Illustratively, a gate structure 207 is formed on the semiconductor substrate 200. The gate structure 207 includes a gate dielectric layer and a gate material layer sequentially stacked from bottom to top. The gate dielectric layer includes an oxide layer, such as a silicon dioxide ($SiO_2$) layer. The gate material layer includes one or more of a polysilicon layer, a metal layer, a conductive metal nitride layer, a conductive metal oxide layer, and a metal silicide layer. Spacer structures located at two sides of the gate structure 207 and close to the gate structure 207 are further formed on the semiconductor substrate 200.

In an embodiment, as shown in FIG. 2A, the second drift region 203 and the first drift region 204 are respectively disposed on two sides of the gate structure 207, a part of the gate structure 207 covers a part of the first drift region 204, and a part of the gate structure 207 covers a part of the second drift region 203.

In another embodiment, as shown in FIG. 2B, a part of the gate structure 207 covers a part of the first drift region 204.

By forming the first drift region 204 and the second drift region 203 located on two sides of the gate structure 207, a symmetric transistor is formed, as shown in FIG. 2A; while, when the first drift region 204 is formed on only one side of the gate structure 207, then an asymmetric transistor can be formed, as shown in FIG. 2B.

Illustratively, a first trench is formed in the first drift region 204, and a drain region 206 is formed in the semiconductor substrate 200 at the bottom of the first trench.

In an embodiment, as shown in FIG. 2B, a first trench is formed in the first drift region 204, and a drain region 206 is formed in the semiconductor substrate 200 at the bottom of the first trench. A source region 205 is formed on a surface of the semiconductor substrate 200, and the source region 205 and the drain region 206 are respectively disposed on two sides of the gate structure 207.

By forming the first trench in the first drift region 204 and forming the drain region 206 in the semiconductor substrate 200 at the bottom of the first trench, the length of the first drift region 204 is lengthened longitudinally, thereby improving the withstand voltage of the drain terminal of the semiconductor device while reducing the area of the semiconductor device.

In another embodiment, as shown in FIG. 2A, a first trench is formed in the first drift region 204, and a drain region 206 is formed in the semiconductor substrate 200 at the bottom of the first trench, a second trench is formed in the second drift region 203, and a source region 205 is formed in the semiconductor substrate 200 at the bottom of the second trench.

By forming the first trench and the second trench in the first drift region 204 and the second drift region 203 respectively, forming the drain region 206 in the semiconductor substrate 200 at the bottom of the first trench, and forming the source region 205 in the semiconductor substrate 200 at the bottom of the second trench, the lengths of the first drift region 204 and the second drift region 203 are lengthened longitudinally, thereby improving the withstand voltage of the two terminals of the semiconductor device while reducing the area of the semiconductor device.

Figure 3:
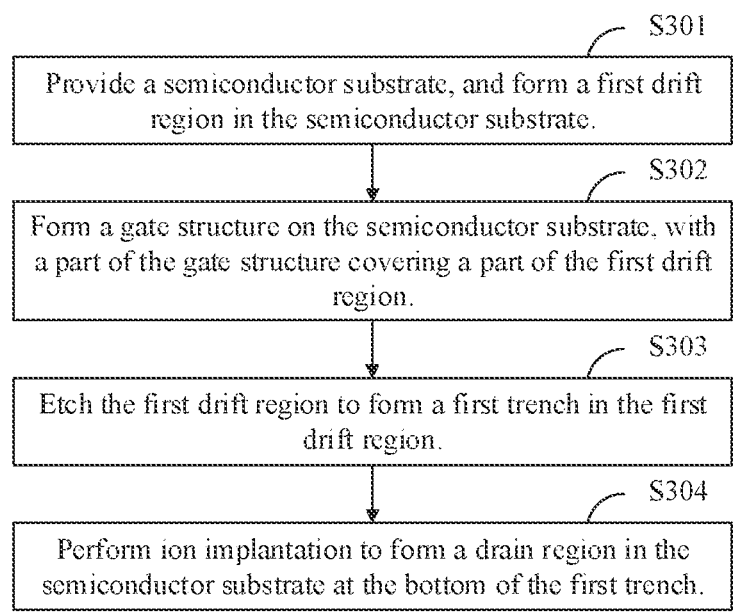
FIG. 3 shows a schematic flowchart of a manufacturing method for a semiconductor device according to an exemplary embodiment of the present disclosure.

Referring to FIGS. 2A, 2B, and 3, in which, FIG. 2A is a cross-sectional view of a semiconductor device according to an exemplary embodiment of the present disclosure, FIG.

2B is a cross-sectional view of another semiconductor device according to an exemplary embodiment of the present disclosure, and FIG. 3 shows a schematic flowchart of a manufacturing method for a semiconductor device according to an exemplary embodiment of the present disclosure.

The present disclosure provides a manufacturing method for a semiconductor device, as shown in FIG. 3, which mainly includes the following steps.

At step S301, a semiconductor substrate is provided, and a first drift region is formed in the semiconductor substrate.

At step S302, a gate structure is formed on the semiconductor substrate, a part of the gate structure covers a part of the first drift region.

At step S303, the first drift region is etched to form a first trench in the first drift region.

At step S304, ion implantation is performed to form a drain region in the semiconductor substrate at a bottom of the first trench.

The manufacturing method for a semiconductor device of the present disclosure specifically includes the following steps.

First, step S101 is performed: a semiconductor substrate 200 is provided, and a first drift region 204 is formed in the semiconductor substrate.

Illustratively, the semiconductor device includes an LDMOS device or an EDMOS device.

Illustratively, the semiconductor substrate 200 may be at least one of the following mentioned materials: single crystal silicon, silicon on insulator (SOI), stacked silicon on insulator (SSOI), stacked silicon germanium on insulator (S-SiGeOI), silicon germanium on insulator (SiGeOI), germanium on insulator (GeOI), and the like. In this embodiment, the semiconductor substrate 200 is a P-type silicon substrate (P-sub), and a specific doping concentration thereof is not limited by the present disclosure. The semiconductor substrate 200 may be formed by epitaxial growth, or may be a wafer substrate.

Illustratively, an isolation structure 202 is further formed in the semiconductor substrate 200, The isolation structure 202 is a shallow trench isolation (STI) structure or a local oxidation of silicon (LOCOS) isolation structure. The isolation structure divides the semiconductor substrate 200 into different active regions, and various semiconductor devices, such as NMOS and PMOS and the like, can be formed in the active regions. Various well structures are further formed in the semiconductor substrate 200.

Illustratively, a well region 201 is formed in the semiconductor substrate 200.

Illustratively, the well region 201 is formed in the semiconductor substrate 200 by using a well implantation process. As an example, a P-type well region (P-well) is formed in the semiconductor substrate by using a standard well implantation process. The P-type well region can be formed by a high energy implantation process, or the P-type well region can be formed by a low energy implantation in combination with a high-temperature thermal annealing process.

Illustratively, a first drift region 204 is formed in the semiconductor substrate.

Illustratively, at least a first drift region (Drift) 204 is formed in the semiconductor substrate 200. In an embodiment, only the first drift region 204 is formed in the semiconductor substrate, as shown in FIG. 2B. In another embodiment, a first drift region 204 and a second drift region 203 are formed in the semiconductor substrate, as shown in FIG. 2A.

Illustratively, the first drift region 204 and/or the second drift region 203 are located in the semiconductor substrate 200 and are generally lightly doped regions. For N-channel transistors, the drift regions are N-type doped. As an example, first, a drift region masking layer is formed on the semiconductor substrate 200. Specifically, the drift region masking layer is a photoresist layer. Then, an opening pattern is formed in the photoresist by exposing and developing processes. Then, the first drift region 204 and/or the second drift region 203 are formed in the region of the opening by a high-energy implantation process, alternatively, the first drift region 204 and/or the second drift region 203 may also be formed by a low-energy implantation in combination with a high-temperature thermal annealing process.

Next, step S102 is performed: a gate structure 207 is formed on the semiconductor substrate 200, and a part of the gate structure 207 covers a part of the first drift region 204.

Illustratively, a gate structure 207 is formed on the semiconductor substrate 200, The gate structure 207 includes a gate dielectric layer and a gate material layer sequentially stacked from bottom to top. The gate dielectric layer includes an oxide layer, such as a silicon dioxide ($SiO_2$) layer. The gate material layer includes one or more of a polysilicon layer, a metal layer, a conductive metal nitride layer, a conductive metal oxide layer, and a metal suicide layer. Spacer structures located at two sides of the gate structure 207 and close to the gate structure 207 are further formed on the semiconductor substrate 200.

In an embodiment, as shown in FIG. 2A, the second drift region 203 and the first drift region 204 are respectively disposed on two sides of the gate structure 207, a part of the gate structure 207 covers a part of the first drift region 204, and a part of the gate structure 207 covers a part of the second drift region 203.

In another embodiment, as shown in FIG. 2B, a part of the gate structure 207 covers a part of the first drift region 204.

By forming the first drift region 204 and the second drift region 203 located on two sides of the gate structure 207, a symmetric transistor is formed, as shown in FIG. 2A; while, when the first drift region 204 is formed on only one side of the gate structure 207, then an asymmetric transistor can be formed, as shown in FIG. 2B.

Next, step S303 is performed: the first drift region 204 is etched to form a first trench in the first drift region 204.

In an embodiment, as shown in FIG. 2B, only the first drift region 204 is etched to form the first trench in the first drift region 204.

In another embodiment, as shown in FIG. 2A, the first drift region 204 and the second drift region 203 are etched to form the first trench in the first drift region 204 and to form the second trench in the second drift region 203.

For etching the first drift region 204 and/or the second drift region 203, dry etching or wet etching may be used. Illustratively, the dry etching process includes, but is not limited to, reactive ion etching (RIE), ion beam etching, plasma etching, laser ablation, or any combination of these methods. A single etching method may also be used, or more than one etching method may be used. The source gas for the dry etching may include HBr and/or $CF_4$ gas.

Next, step S304 is performed: ion implantation is performed to form a drain region 206 in the semiconductor substrate 200 at the bottom of the first trench.

Illustratively, the method further includes a step of forming a source region 205 at the same time of forming the drain region 206.

In an embodiment, as shown in FIG. 2B, the step of forming the source region 205 includes: performing ion implantation to form the source region 205 on a surface of the semiconductor substrate 200.

In another embodiment, as shown in FIG. 2A, the step of forming the source region 205 includes: performing ion implantation to form the source region 205 in the semiconductor substrate 200 at a bottom of the second trench.

As an example, N-type impurities are implanted into the surface of the semiconductor substrate 200 or in the semiconductor substrate 200 at the bottom of the second trench to form the source region 205, and N-type impurities are implanted in the semiconductor substrate 200 at the bottom of the first trench to form the drain region 206. The doping concentration of the source region 205 and the doping concentration of the drain region 206 may be the same. Therefore, the source region 205 and the drain region 206 can be formed by doping simultaneously.

By forming the first trench in the first drift region 204 and forming the drain region 206 in the semiconductor substrate 200 at the bottom of the first trench, the length of the first drift region 204 is lengthened longitudinally, thereby improving the withstand voltage of the drain terminal of the semiconductor device while reducing the area of the semiconductor device.

Further, by forming the first trench and the second trench in the first drift region 204 and the second drift region 203 respectively, forming the drain region 206 in the semiconductor substrate 200 at the bottom of the first trench, and forming the source region 205 in the semiconductor substrate 200 at the bottom of the second trench, the lengths of the first drift region 204 and the second drift region 203 are lengthened longitudinally, thereby improving the withstand voltage of the two terminals of the semiconductor device while reducing the area of the semiconductor device.

The present disclosure has been described through the above embodiments, but it should be understood that, the above embodiments are merely for the purpose of illustration and description, and are not intended to limit the present disclosure to the scope of the described embodiments. In addition, those skilled in the art can understand that, the present application is not limited to the above described embodiments, further variations and modifications can be made according to the teachings of the present disclosure, and these variations and modifications all fall within the claimed protection scope of the present disclosure. The protection scope of the present disclosure is defined by the appended claims and equivalent scope thereof.

What is claimed is:

1. A semiconductor device, comprising:
    a semiconductor substrate;
    a first drift region formed in the semiconductor substrate, a first trench being formed in the first drift region;
    a gate structure formed on the semiconductor substrate, a part of the gate structure covering a part of the first drift region;
    a drain region formed at a bottom of the first trench, wherein edges of the drain region are in contact with sidewalls of the first trench;
    a source region, the source region and the drain region being respectively disposed on two sides of the gate structure; and
    a second drift region located in the semiconductor substrate, the second drift region and the first drift region being respectively disposed on two sides of the gate structure, a part of the gate structure covering a part of the second drift region.

2. The semiconductor device according to claim 1, wherein the source region is disposed on a surface of the semiconductor substrate.

3. The semiconductor device according to claim 1, wherein a second trench is formed in the second drift region, and the source region is formed in the semiconductor substrate at a bottom of the second trench.

4. The semiconductor device according to claim 1, further comprising:
    an isolation structure disposed on outer sides of the drain region and the source region.

5. The semiconductor device according to claim 4, wherein the isolation structure comprises a trench isolation structure or a local oxidation of silicon isolation.

6. The semiconductor device according to claim 1, wherein the drain region is formed in the first drift region.

7. The semiconductor device according to claim 3, wherein the source region is formed in the second drift region.

8. A manufacturing method for a semiconductor device, comprising steps of:
    providing a semiconductor substrate, and forming a first drift region in the semiconductor substrate;
    forming a gate structure on the semiconductor substrate, with a part of the gate structure covering a part of the first drift region;
    etching the first drift region to form a first trench in the first drift region;
    performing ion implantation to form a drain region at a bottom of the first trench, wherein edges of the drain region are in contact with sidewalls of the first trench
    forming a second drift region in the semiconductor substrate, the second drift region and the first drift region being respectively disposed on two sides of the gate structure, and a part of the gate structure covering a part of the second drift region;
    etching the second drift region to form a second trench in the second drift region; and
    performing ion implantation to form a source region in the semiconductor substrate at a bottom of the second trench.

9. The manufacturing method according to claim 8, further comprising:
    performing ion implantation to form a source region on a surface of the semiconductor substrate.

10. The manufacturing method according to claim 8, wherein the forming the first drift region in the semiconductor substrate and the forming the second drift region in the semiconductor substrate are performed in one same step, the forming the first trench in the first drift region and the forming the second trench in the second drift region are performed in one same step.

11. The manufacturing method according to claim 8, wherein the step of forming the drain region in the semiconductor substrate at the bottom of the first trench comprises forming the drain region in the first drift region.

12. The manufacturing method according to claim 9, wherein the step of forming the source region in the semiconductor substrate at the bottom of the second trench comprises forming the source region in the second drift region.

13. The semiconductor device according to claim 1, wherein the semiconductor device comprises an LDMOS device or an EDMOS device.

14. The semiconductor device according to claim 1, wherein the gate structure comprises a gate dielectric layer and a gate material layer sequentially stacked from bottom to top.

15. The semiconductor device according to claim 14, wherein the gate material layer comprises one or more of a polysilicon layer, a metal layer, a conductive metal nitride layer, a conductive metal oxide layer, and a metal silicide layer.

16. The semiconductor device according to claim 1, further comprising spacer structures located at two sides of the gate structure and close to the gate structure and formed on the semiconductor substrate.

17. The manufacturing method according to claim 9, wherein, the source region is formed at the same time of forming the drain region.

\* \* \* \* \*